July 3, 1962 I. LADANY ETAL 3,042,884

HIGH Q TUNED NETWORK UTILIZING BIASED DOUBLE-BASE DIODE AS INDUCTIVE ELEMENT

Filed Feb. 28, 1961

INVENTORS
IVAN LADANY
ROBERT J. KEARNEY

C. E. Vautrain Jr., AGENT

BY Richard C. Reed

ATTORNEY

United States Patent Office 3,042,884

Patented July 3, 1962

3,042,884

HIGH Q TUNED NETWORK UTILIZING BIASED DOUBLE-BASE DIODE AS INDUCTIVE ELEMENT

Ivan Ladany, Alexandria, and Robert J. Kearney, Ames, Iowa, assignors to the United States of America as represented by the Secretary of the Navy Filed Feb. 28, 1961, Ser. No. 92,423
10 Claims. (Cl. 333—76)
(Granted under Title 35, U.S. Code (1952), sec. 266)

The invention described herein may be manufactured and used by or for the Government of the United States of America for governmental purposes without the payment of any royalties thereon or therefor.

The present invention relates in general to tuned networks and more particularly to a high Q tuned network having components which can be made by solid state techniques.

It is a continuing aim and desire that electronic components be reduced in size as well as made more stable. This is especially applicable where the components are to be installed in rockets or missiles or otherwise used where size and stability are highly important factors.

Included in conventional tuned networks are components such as quartz crystals and mechanical resonators which are affected by gravitational forces and therefore not very well adapted for operation in missiles. Further, prior tuned network devices such as those using coils, as well as other solid state networks, generally have a Q of the order of 150 or less whereas a substantially higher Q, e.g. one of the order of 500 or higher, is often required.

The network of the present invention avoids the foregoing and other limitations of prior tuned network devices and provides a smaller, lighter device which in addition can be made with solid state techniques. The network of the present invention is not affected by gravitational forces and will operate at frequencies where quartz crystals are not available. It is much smaller than conventional tuned network devices, has a higher Q, and uses a readily available junction device in lieu of the quartz crystals, mechanical resonators and coils of existing devices.

Accordingly, it is an object of the present invention to provide a tuned network of sufficient stability and yet small enough to be used in missiles and devices having similar environmental requirements.

It is another object of the present invention to provide a tuned network which can be made with solid state techniques, i.e. one adaptable to microelectronic techniques.

It is a further object of this invention to provide a tuned network which uses both the inductance and the negative resistance of a conventional junction device to obtain a high Q.

It is still another object of this invention to provide a tuned network having a very high Q and which uses a solid state inductance.

It is a further object of this invention to provide a tuned network which is small and light, which can be made with solid state techniques, which has sufficient stability for use in missiles, and which has a high Q.

It is a further object of the present invention to provide a network which behaves as a series resonant LC network and yet has a very high Q.

Other objects and many of the attendant advantages of this invention will be readily appreciated as the same becomes better understood by reference to the following detailed description when considered in connection with the accompanying drawings in which like parts have like numerals and wherein.

The tuned network of the present invention is a unique arrangement of component elements, which include a double-base diode, selected resistors and capacitors, and at least one source of potential, that behave as a series resonant LC network having a very high Q.

Figure 1:
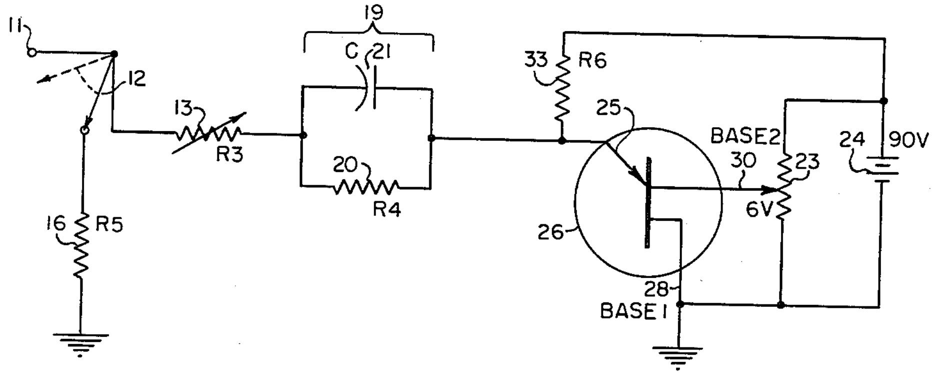
FIG. 1 is a circuit diagram of one embodiment of the invention.
Figure 2:
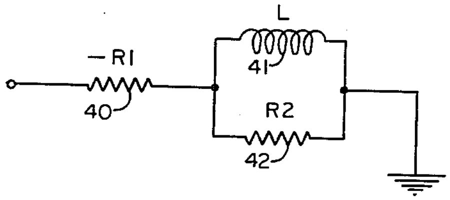
FIG. 2 shows an equivalent circuit fora portion of the network in the embodiment of FIG. 1.

Referring to FIGS. 1 and 2, an embodiment of the present invention is shown having input terminal 11 and resistance 13 connected in series with RC circuit 19 the latter including resistance 20 and capacitor 21. Switch 12 provides means for connecting resistance 16 in parallel with the network when it is desired to suppress second harmonics internally. Such suppression is desired where the network is associated with other circuits which would respond to the second harmonic of the resonant frequency of the network. Also connected to RC circuit 19 is emitter electrode 20 of double-base diode 26. The double-base diode has one of its base electrodes 28 connected to ground and the other base electrode 30 biased at 6 volts through potentiometer 23. The emitter electrode is returned through resistance 33 to a D.C. source of potential 24 supplying 90 volts. Although one source of potential has been included, it is possible to obtain comparable results with dual sources of potential, the function of voltage in either event being to provide negative resistance by means of conductivity modulation and to drive the diode into its inductive region.

The double-base diode may be considered as a diode in series with negative resistance 40 and can be represented by the equivalent circuit shown in FIG. 2. The negative resistance arises because of conductivity modulation. In the network of FIG. 1, if resistance 20 is set equal to the resistance 42 of double-base diode 26, a series-tuned network results with its resonant frequency obtained from the formula:

$$f_0=\frac{1}{2\pi\sqrt{LC}}$$

where C is the capacitance of capacitor 21 and L is the inductance of double-base diode 26. The series resistance has a broad minimum at the resonant frequency and if resistance 40 is sufficiently large to net series resistance can be given any positive or negative value by adjustment of resistance 13. The Q of this network is thus capable of being made arbitrarily high.

For optimum operation; resistance 20 should have a value equivalent to the parallel resistance of diode 26 when suitably biased to have an inductive characteristic.

In addition, resistance 13 is adjusted to bring the net series resistance to zero. The value of resistance 16 must be selected both with respect to stable operation and the level of Z. As resistance 16 is lowered the value of Q increases, but if it becomes too low the circuit becomes unstable and produces strong oscillation at the second harmonic of the resonant frequency.

Figure 3:
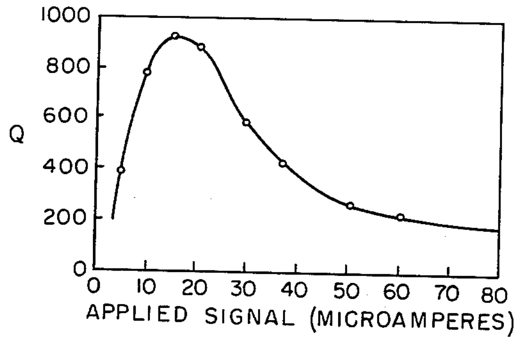
FIG. 3 is a graphical representation of the performance of the embodiment of FIG. 1.

FIG. 3 is a plot of the measured Q of the network of FIG. 1, as a function of the applied signal, with the network connected as a frequency rejection filter operation near 35 kc. The Q's obtained were determined by the equation:

$$Q=\frac{f_0}{|f_0-f'|}$$

where $f'$ is the frequency at which the r.m.s. value of the output voltage at resonance. The maximum Q is seen to be greater than 900, and values as high as 1200 have also been obtained.

At low values of signal strength, noise originating in diode 26 limits the Q, while at high values of signal strength the Q is reduced by the harmonics, principally the second, generated by the diode which will appear as signal if the circuit with which it is associated less wide enough frequency response 3. Resistance 16 serves to partially shunt these harmonics. Lower values of resistance 16 give an even higher Q, and if the second harmonic is removed by another filter, the Q is too high to be measured by simple techniques.

In the embodiment tested, the diode was maintained at even temperature thereby eliminating the need for temperature compension. However, standard techniques exist for providing compensation and may be utilized where desired. One technique could include a capacitor 21 having such a temperature coefficient that it exactly compensates the variation in diode 26.

The values of components in the tested embodiment are as follows:

$R_3$=170 ohms
$R_4$=1.9K ohms
$R_5$=100 ohms
$R_6$=90K ohms
C=0.01 $\mu f$

The diode used was a 2N489

The ultimate value of Q appears to be determined by the requirements for stability as well as by the noise level. The network of the present invention is particularly outstanding because of its miniature size while comprising only components which can be made by solid state techniques. Further, a Q is obtained which approaches that of quartz crystals without the size, frequency, and other limitations of quartz crystals. It is noted that the network should exhibit improved performance when improvements in double-base diodes are realized, such as reducing the base 1 to base 2 distance thereby making the diode work at higher frequencies, or reducing the area of the emitter contact to increase the inductance of the diode thereby making the device work at lower frequencies. A solid state capacitor could be used for the capacitor network, thereby providing a reduction in size and a means for temperature compensation. The applied signal level could be increased by further suppression of the second harmonic. The foregoing could provide an increase in Q of the order of several thousand.

A voltage dependent resistance, such as a diode, may be added in series with the network to provide correct resistive compensation if the frequency is electrically varied. A bias network can also be developed to provide temperature compensation for the double-base diode of the present invention.

It will be understood that various changes in the details and arrangements of parts and circuits, and in the selection of biases, frequencies and diodes, which have been herein described and illustrated in order to explain the nature of the invention, may be made by those skilled in the art within the principle and scope of the invention as expressed in the appended claims.

Obviously many modifications and variations of the present invention are possible in the light of the above teachings. It is therefore to be understood that within the scope of the appended claims the invention may be practiced otherwise than as specifically described.

What is claimed is:

1. A solid state tuned network comprising, a double-base diode biased to have an inductive characteristic, and a capacitance-resistance circuit connected thereto to provide a resonant network.

2. A solid state tuned network comprising, a double-base diode biased to have an inductive characteristic, and a capacitance-resistance circuit connected thereto to provide a resonant network, said capacitance-resistance circuit having a value selected to compensate the parallel resistance of said double-base diode.

3. A solid state tuned network comprising, a double-base diode biased to have an inductive characteristic, and a capacitance-resistance circuit connected to the emitter electrode of said double-base diode to provide a series resonant network.

4. A solid state tuned network comprising, a double-base diode biased to have an inductive characteristic, and a capacitance-resistance circuit connected to the emitter electrode of said double-base diode to provide a series resonant network, the resistance of said capacitance-resistance circuit being connected in parallel with the capacitance thereof and having a value selected to compensate for the parallel resistance of the double-base diode.

5. A solid state tuned network comprising, a double-base diode biased to have an inductive characteristic, a capacitance-resistance circuit connected to the emitter electrode of said double-base diode to provide a series resonant network, and a resistance means connected in series with the resistance of said capacitance-resistance circuit and having a value selected to substantially reduce the net series resistance of the tuned network.

6. A solid state tuned network comprising, a double-base diode biased to have an inductive characteristic, a capacitance-resistance circuit connected to the emitter electrode of said double-base diode to provide a series resonant network, the resistance of said capacitance-resistance circuit being connected in parallel with the capacitance thereof and having a value selected to compensate for the parallel resistance of the double-base diode, and a resistance means connected in series with the resistance of said capacitance-resistance circuit and having a value selected to substantially reduce the net series resistance of the tuned network.

7. A solid state tuned network comprising, a double-base diode biased to have an inductive characteristic, a capacitance-resistance circuit connected thereto to provide a resonant network, and second harmonic suppression means connected in parallel with said resonant network to raise the Q thereof.

8. A solid state tuned network comprising, a double-base diode biased to have an inductive characteristic, a capacitance-resistance circuit connected to the emitter electrode of said double-base diode to provide a series resonant network, resistance means connected in series with the resistance of said capacitance-resistance circuit and having a value selected to substantially reduce the net series resistance of the tuned network, and second harmonic suppression means connected in parallel with said resonant network to raise the Q thereof.

9. A solid state tuned network comprising, a double-base diode biased to have an inductive characteristic, a capacitance-resistance circuit connected to the emitter electrode of said double-base diode to provide a series resonant network, the resistance of said capacitance-resistance circuit being connected in parallel with the capacitance thereof and having a value selected to compensate for the parallel resistance of the double-base diode, resistance means connected in series with the resistance of said capacitance-resistance circuit and having a value selected to substantially reduce the net series resistance of the tuned network, and second harmonic suppression means connected in parallel with said resonant network to raise the Q thereof.

10. A solid state tuned network comprising a double-base diode biased to have an inductive characteristic, a capacitance-resistance circuit connected to the emitter electrode of said double-base diode to provide a series resonant network, the resistance of said capacitance-resistance circuit being connected in parallel with the capacitance thereof and having a value selected to compensate for the parallel resistance of the double-base diode, first resistance means connected in series with the resistance of said capacitance-resistance circuit and having a value selected to substantially reduce the net series resistance of the tuned network, and second resistance means connected in parallel with the series connection of said first resistance means, said resistance of said capacitance-resistance circuit and said double-base diode to reduce second order harmonics generated in said resonant network.

No references cited.